(12) United States Patent
Lin

(10) Patent No.: US 8,963,862 B2
(45) Date of Patent: Feb. 24, 2015

(54) DRIVING SIGNAL GENERATING SYSTEM FOR A TOUCH PANEL

(75) Inventor: Po-Chuan Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 284 days.

(21) Appl. No.: 13/618,748

(22) Filed: Sep. 14, 2012

(65) Prior Publication Data

US 2014/0028581 A1 Jan. 30, 2014

(30) Foreign Application Priority Data

Jul. 25, 2012 (TW) .............................. 101126874 A

(51) Int. Cl.
*G06F 3/041* (2006.01)
(52) U.S. Cl.
USPC ....................................... 345/173; 178/18.03
(58) Field of Classification Search
CPC ... G06F 3/03547; G06F 3/038; G06F 3/0383; G06F 3/044; G06F 3/05
USPC ......... 345/173–174; 178/18.01, 18.02, 18.06, 178/20.01
See application file for complete search history.

(56) References Cited

U.S. PATENT DOCUMENTS

| 2005/0248558 A1* | 11/2005 | Kobashi | 345/204 |
| 2008/0309622 A1* | 12/2008 | Krah | 345/173 |
| 2010/0182278 A1* | 7/2010 | Li et al. | 345/174 |

* cited by examiner

*Primary Examiner* — Allison Johnson
(74) *Attorney, Agent, or Firm* — Huffman Law Group, PC

(57) ABSTRACT

In a driving signal generating system, a boost circuit provides a power voltage, an amplifier provides an analog waveform driving signal, and a level shifter provides a digital waveform driving signal. A select device selects the analog waveform driving signal as a driving signal for a touch panel in an analog waveform mode, and selects the digital waveform driving signal as a driving signal for the touch panel in a digital waveform mode. The boost circuit provides the power voltage to the amplifier, and the amplifier, in the digital waveform mode, generates an output voltage as a power for at least one last stage of the level shifter.

14 Claims, 6 Drawing Sheets

US 8,963,862 B2

DRIVING SIGNAL GENERATING SYSTEM FOR A TOUCH PANEL

BACKGROUND OF THE INVENTION

1. Field of the Invention

The present invention generally relates to a touch panel, and more particularly to a driving signal generating system for providing a driving signal to a touch panel.

2. Description of the Related Art

A touch panel may be combined with a display screen to result in a touch screen. Touch screens have been widely used as input interfaces for electronic devices for detecting touch inputs within a display area. The touch technology utilized in the touch panel may be, for example, capacitive, resistive or optical, among which capacitive touch technology is presently the most popular.

A capacitive touch panel is typically made of horizontal electrodes and vertical electrodes, cross points of which are defined as touch points. When the touch panel is operated, an electric field is formed between two electrodes at the touch point. A finger touching the panel blocks some of the electric field, therefore reducing capacitance at the touch point. A touch point may thus be detected according to change of the capacitance.

In a conventional touch system, a driving signal is used to drive horizontal electrodes, and an induced signal is generated at vertical electrodes due to capacitive coupling effect. The induced signal is then processed by a signal processing technique. When a finger or a conductive object (e.g., a stylus) touches a driven horizontal electrode, the electric field associated with the touch point is affected to generate an abnormal induced signal at a corresponding vertical electrode.

FIG. 1A schematically shows a conventional driving signal generating system for generating a square wave driving signal for a touch panel. A level shifter 11 receives a square wave signal and pulls up a level of the square wave signal to generate a square wave driving signal. A charge pump 12 is commonly used to provide a power to the level shifter 11 to increase a level of the square wave driving signal in order to resist noise. FIG. 1B shows an exemplary square wave signal 111 and a generated square wave driving signal 112. The power provided by the charge pump 12, however, may be affected by temperature such that the level of the square wave driving signal 112 may accordingly be changed to that of a square wave driving signal 113 as exemplified in FIG. 1B, thereby reducing detection accuracy. In order to make to the power provided by the charge pump 12 less liable to temperature, a low-dropout (LDO) regulator may be adopted but at a cost of increasing circuit area.

A need has thus arisen to propose a novel driving signal generating system for providing a stable driving signal for a touch panel, without being affected by temperature and increasing circuit area, to increase detection accuracy at a touch point.

SUMMARY OF THE INVENTION

In view of the foregoing, an embodiment of the present invention provides a driving signal generating system for providing a driving signal for a touch panel. The embodiment is capable of selecting an analog waveform driving signal or a digital waveform driving signal for the touch panel, and the embodiment generates a driving signal that is not affected by temperature, is capably adjusted according to environment or requirement, and does not increase circuit area.

According to one embodiment, a driving signal generating system includes a boost circuit, an amplifier, a level shifter and a select device. The boost circuit provides a power voltage, the amplifier provides an analog waveform driving signal, and the level shifter provides a digital waveform driving signal. The select device selects the analog waveform driving signal as a driving signal for a touch panel in an analog waveform mode, and selects the digital waveform driving signal as the driving signal for the touch panel in a digital waveform mode. The boost circuit provides the power voltage to the amplifier, and the amplifier generates an output voltage as a power in the digital waveform mode for at least one last stage of the level shifter.

DETAILED DESCRIPTION OF THE INVENTION

Figure 2:
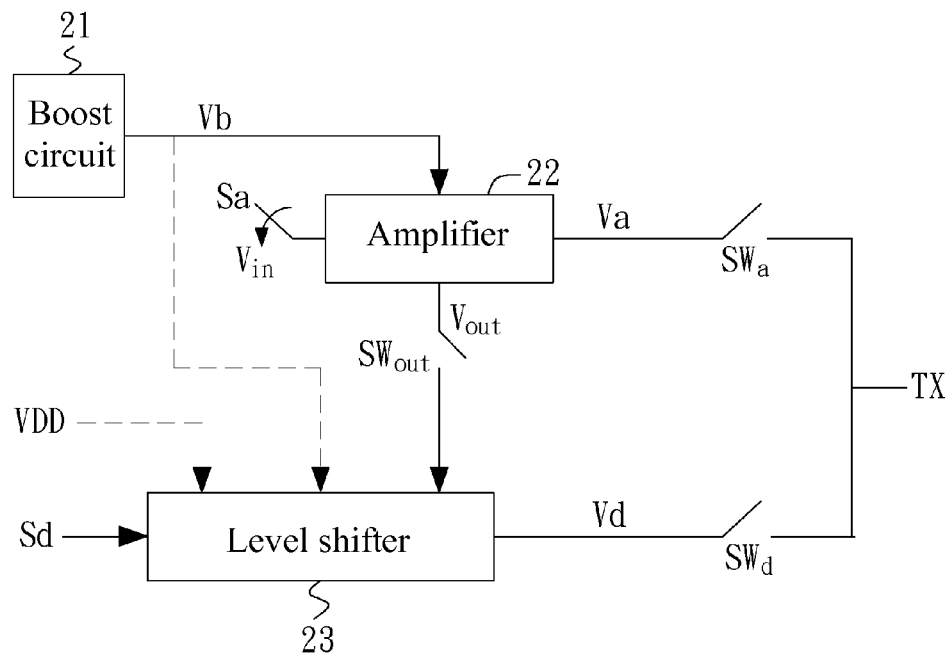
FIG. 2 shows a system block diagram of a driving signal generating system according to one embodiment of the present invention.

FIG. 2 shows a system block diagram of a driving signal generating system 200 adaptable to a touch panel (not shown) for providing a driving signal TX to the touch panel according to one embodiment of the present invention. The driving signal TX is induced by the touch panel to generate an induced signal, which is then processed by a signal processing technique to determine whether the touch panel is touched and to decide a touch point if touched.

In the embodiment, as shown in FIG. 2, a boost circuit 21 provides a power voltage Vb. The boost circuit 21 may be implemented by a variety of voltage converting circuits such as a voltage regulator or a charge pump.

According to one aspect of the embodiment, an amplifier 22 and a level shifter 23 provide an analog waveform (e.g., sinusoidal wave) driving signal Va and a digital waveform (e.g., pulse wave) driving signal Vd, respectively. A select device, composed of at least an analog waveform switch SWa and a digital waveform switch SWd, selects either the analog waveform driving signal Va or the digital waveform driving signal Vd as the driving signal TX for the touch panel. In other words, in an analog waveform mode, the analog waveform switch SWa is close and the digital waveform switch SWd is open, thereby providing the analog waveform driving signal Va as the driving signal TX to the touch panel; in a digital waveform mode, the analog waveform switch SWa is open and the digital waveform switch SWd is close, thereby providing the digital waveform driving signal Vd as the driving signal TX to the touch panel. Accordingly, the driving signal generating system 200 of the embodiment may provide the analog waveform driving signal Va or the digital waveform driving signal Vd to the touch panel according to environment or system requirement.

Figure 3A:
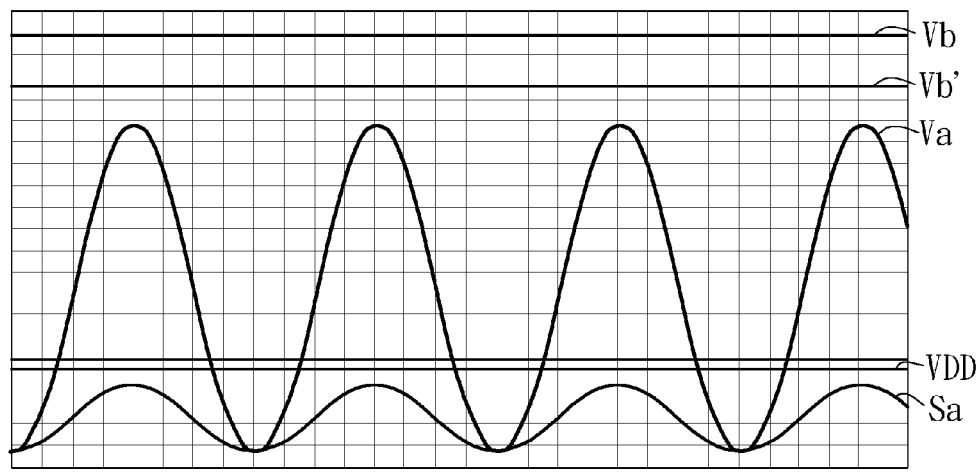
FIG. 3A shows exemplary waveforms of the analog input signal, the analog waveform driving signal and the power voltage of FIG. 2.

Specifically, the boost circuit 21 provides the power voltage Vb to the amplifier 22. In the analog waveform mode, the amplifier 22 receives an analog input signal Sa, which is then amplified to result in the analog waveform driving signal Va. FIG. 3A shows exemplary waveforms of the analog input signal Sa, the analog waveform driving signal Va and the power voltage Vb. In the figure, Vb' represents a least power voltage provided by the boost circuit 21 when it is affected by temperature. In designing the boost circuit 21, it may be assured that the analog waveform driving signal Va is not affected by temperature provided that the least power voltage Vb' is greater than a swing of the analog waveform driving signal Va.

In the digital waveform mode, the amplifier 22 receives an input voltage Vin, which is then amplified to result in an output voltage Vout that is provided, via a close power switch SWout, to at least one last stage of the level shifter 23. With respect to other stages of the level shifter 23, the power voltage Vb of the boost circuit 21 may be used as a power (as indicated by a dashed line in FIG. 2), or the output voltage Vout may be used as a power (provided that the output voltage Vout provided by the amplifier 22 has sufficient driving capability). For example, if the amplifier 22 has sufficient driving capability, the output voltage Vout of the amplifier 22 may be used to provide a power to the entire level shifter 23 (or the power voltage Vb of the boost circuit 21 may be used to provide a power to at least one first stage of the level shifter 23); if the amplifier 22 has insufficient driving capability, the output voltage Vout of the amplifier 22 may be used to provide a power to at least one last stage of the level shifter 23, and the power voltage Vb of the boost circuit 21 may be used to provide a power to at least one first stage of the level shifter 23. Moreover, a low voltage VDD (as compared with Vb or Vout) may be used to provide a power to some digital logic circuits or at least one first stage of the level shifter 23.

Figure 1A:
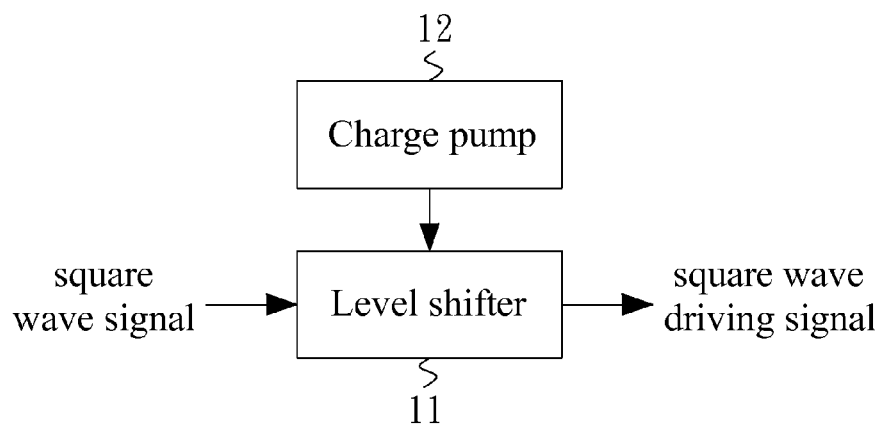
FIG. 1A schematically shows a conventional driving signal generating system.
Figure 1B:
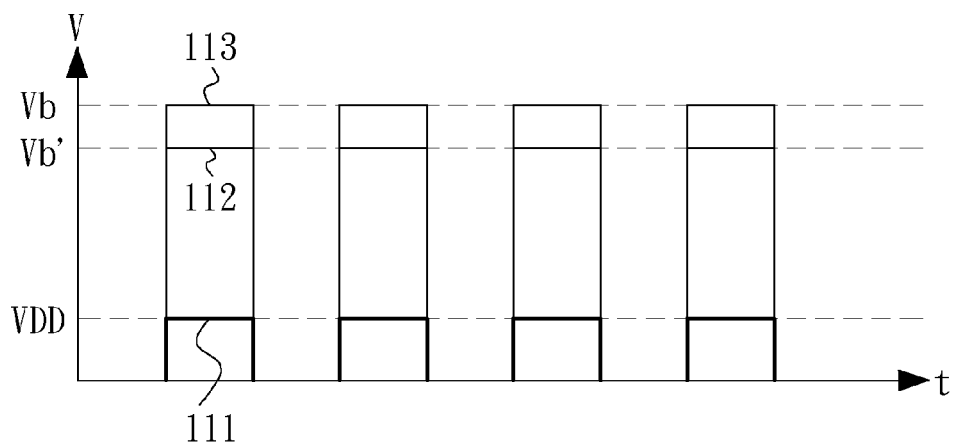
FIG. 1B shows an exemplary square wave signal and generated square wave driving signals of FIG. 1A.
Figure 3B:
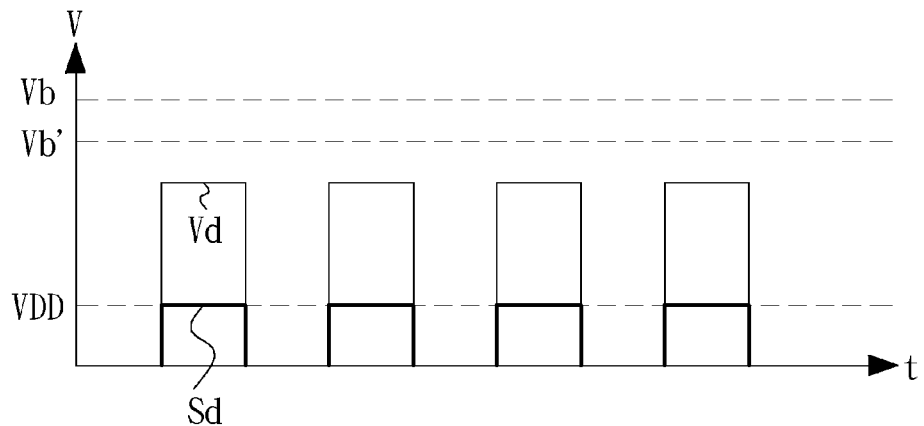
FIG. 3B shows exemplary waveforms of the input signal and the digital waveform driving signal of FIG. 2.

Alternatively, in the digital waveform mode, the level shifter 23 receives an input signal Sd and pulls up a level of the input signal Sd to result in the digital waveform driving signal Vd. According to another aspect of the embodiment, as at least one last stage of the level shifter 23 receives the output voltage Vout as a power, and the output voltage Vout of the amplifier 22 is not affected by temperature, the digital waveform driving signal Vd generated by the level shifter 23 is not accordingly affected as in a conventional level shifter 11 (FIG. 1A and FIG. 1B). FIG. 3B shows exemplary waveforms of the input signal Sd and the digital waveform driving signal Vd. As shown in FIG. 3B, when the power voltage Vb of the boost circuit 21 is changed to the least power voltage Vb' due to temperature change, the resultant digital waveform driving signal Vd is not affected because the level shifter 23 does not use the power voltage Vb or the least power voltage Vb' as a power. Further, in the digital waveform mode, as the embodiment uses the amplifier 22 to provide a required power to the level shifter 23, a low-dropout (LDO) regulator is no longer needed and circuit area may thus be saved.

Figure 4:
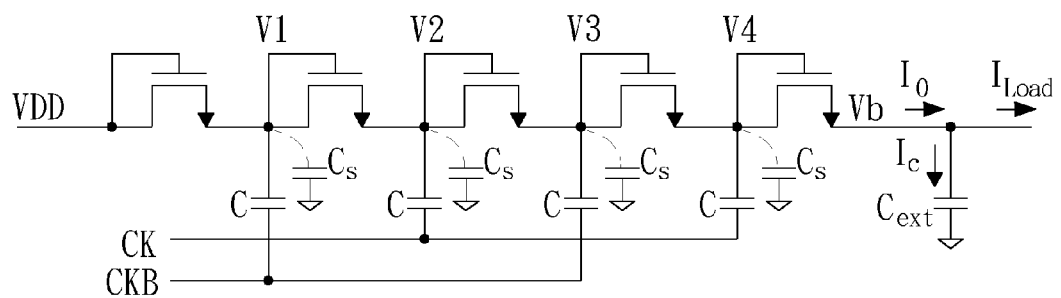
FIG. 4 shows a four-stage Dickson charge pump adapted to implement the boost circuit of FIG. 2.

As mentioned above, the boost circuit 21 of the embedment may be implemented by a variety of voltage converting circuits. FIG. 4 shows a four-stage Dickson charge pump that may be adapted to implement the boost circuit 21 and may be described as follows:

$$V_{out}=V_{DD}+\Delta V-\Sigma_{k=1-4}(V_{th}*V_k)$$

$$\Delta V=V_{DD}[C/(C+C_s)]-[f*(C+C_s)]$$

where $V_k$ is a node voltage of each stage circuit (k from 1 to 4), $\Delta V$ is a voltage difference of each stage circuit, $V_{DD}$ is a logic high-level voltage (or the low voltage) of a pulse/inverted-pulse signal CK/CKB, $V_{th}$ is a frequency of the pulse/inverted-pulse signal CK/CKB, Vth is a threshold voltage of a transistor, C is capacitance of each stage circuit, $C_s$ is parasitic capacitance at each node, $I_O$ is an output current that is split into a current $I_C$ flowing through an external capacitance $C_{ext}$ and a load current $I_{Load}$.

Accordingly, the capacitance C and the threshold voltage Vth of the Dickson charge pump in FIG. 4 are liable to temperature change, such that the power voltage Vb is also affected. Nevertheless, the amplifier 22 and the level shifter 23 of the embodiment are configured to prevent the driving signal TX from being liable to temperature change.

Figure 5:
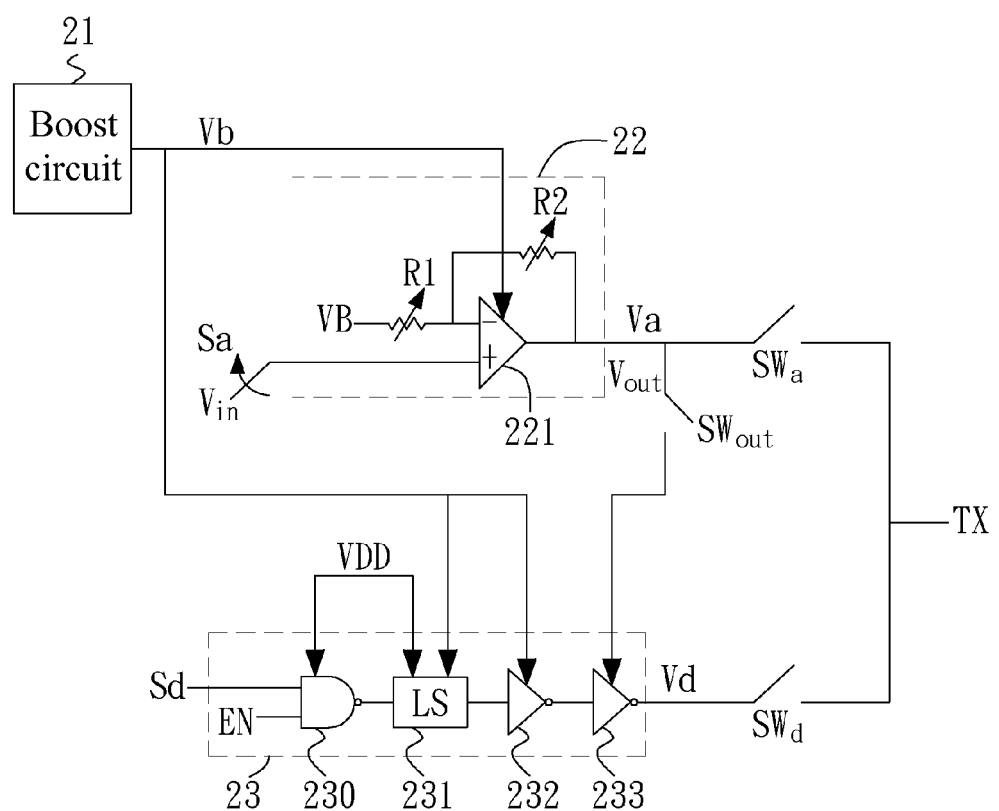
FIG. 5 shows a detailed circuit diagram of the driving signal generating system of FIG. 2.

FIG. 5 shows a detailed circuit diagram of the driving signal generating system 200 of FIG. 2. As shown in FIG. 5, the amplifier 22 primarily includes an operational amplifier 221, a feedback resistor R2 and an input resistor R1. Specifically, the feedback resistor R2 is connected between an output node and an (inverted) input node of the operational amplifier 221, and the input resistor R1 is connected between the (inverted) input node and a base voltage VB. According to the configuration of the amplifier 22 as shown in FIG. 5, the output voltage Vout may be expressed as follows:

$$V_{out}=(1+R2/R1)*pVin-(R2/R1)*VB$$

where Vin and VB are constant direct-current voltage, which may, for example, be provided by a band gap voltage generating circuit, which is not liable to temperature change.

Accordingly, in the digital waveform mode, the amplifier 22 provides the output voltage Vout that is not liable to temperature change such that the digital waveform driving signal Vd of the level shifter 23 is not affected by temperature. Further, in the analog waveform mode, the analog waveform driving signal Va provided by the amplifier 22 may be adaptively adjusted by the resistor R1/R2 according to environment or system requirement.

Still referring to FIG. 5, the level shifter 23 of the embodiment includes, from input to output, a level-shift (LS) circuit 2331, a first inverting buffer 232 and a second inverting buffer 233. Specifically, in the digital waveform mode, the second inverting buffer 233 uses the output voltage Vout of the amplifier 22 as a power, and at least one last stage of the level-shift circuit 231 and the first inverting buffer 232 use the power voltage Vb of the Dickson charge pump 21 as a power. Moreover, a logic circuit 230 (e.g., a logic NAND gate) may be further used before the level-shift circuit 231 to controllably pass the input signal Sd to the level-shift circuit 231 under control of an enable signal EN. The logic circuit 230 and at least one first stage of the level-shift circuit 231 use the low voltage VDD as a power.

Figure 6:
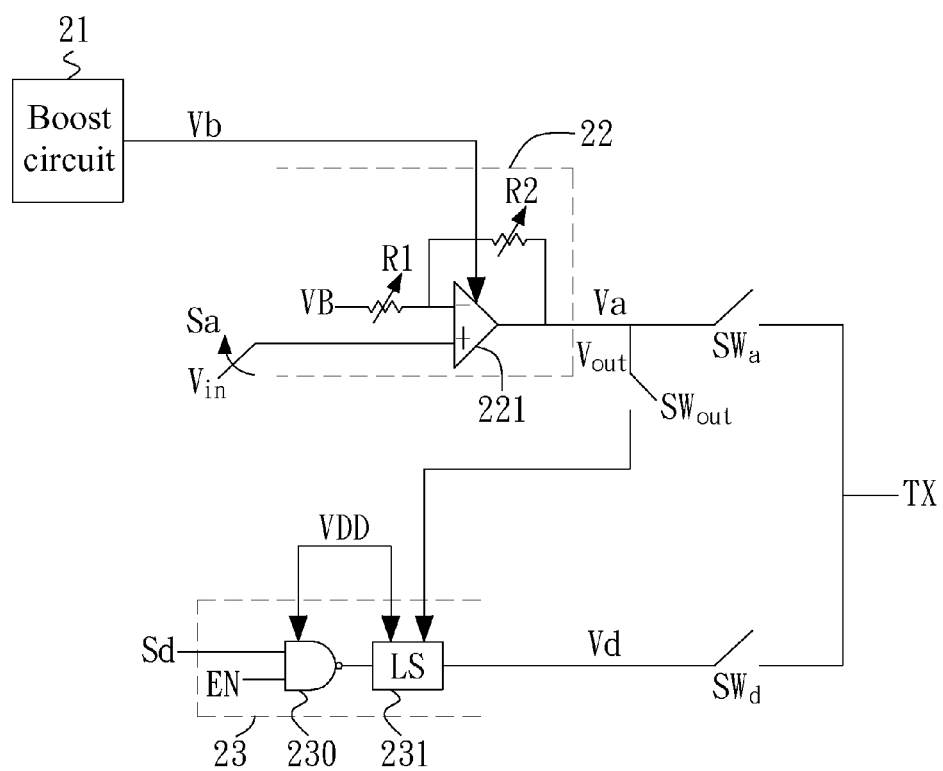
FIG. 6 shows a detailed circuit diagram of another driving signal generating system of FIG. 2.

The level shifter 23 discussed above does not necessarily include the first inverting buffer 232 and the second inverting buffer 233. FIG. 6 shows a detailed circuit diagram of another driving signal generating system 201 of FIG. 2. In the embodiment, at least one last stage of the level-shift circuit 231 uses the output voltage Vout of the amplifier 22 as a power, and at least one first stage of the level-shift circuit 231 uses the low voltage VDD as a power.

Figure 7:
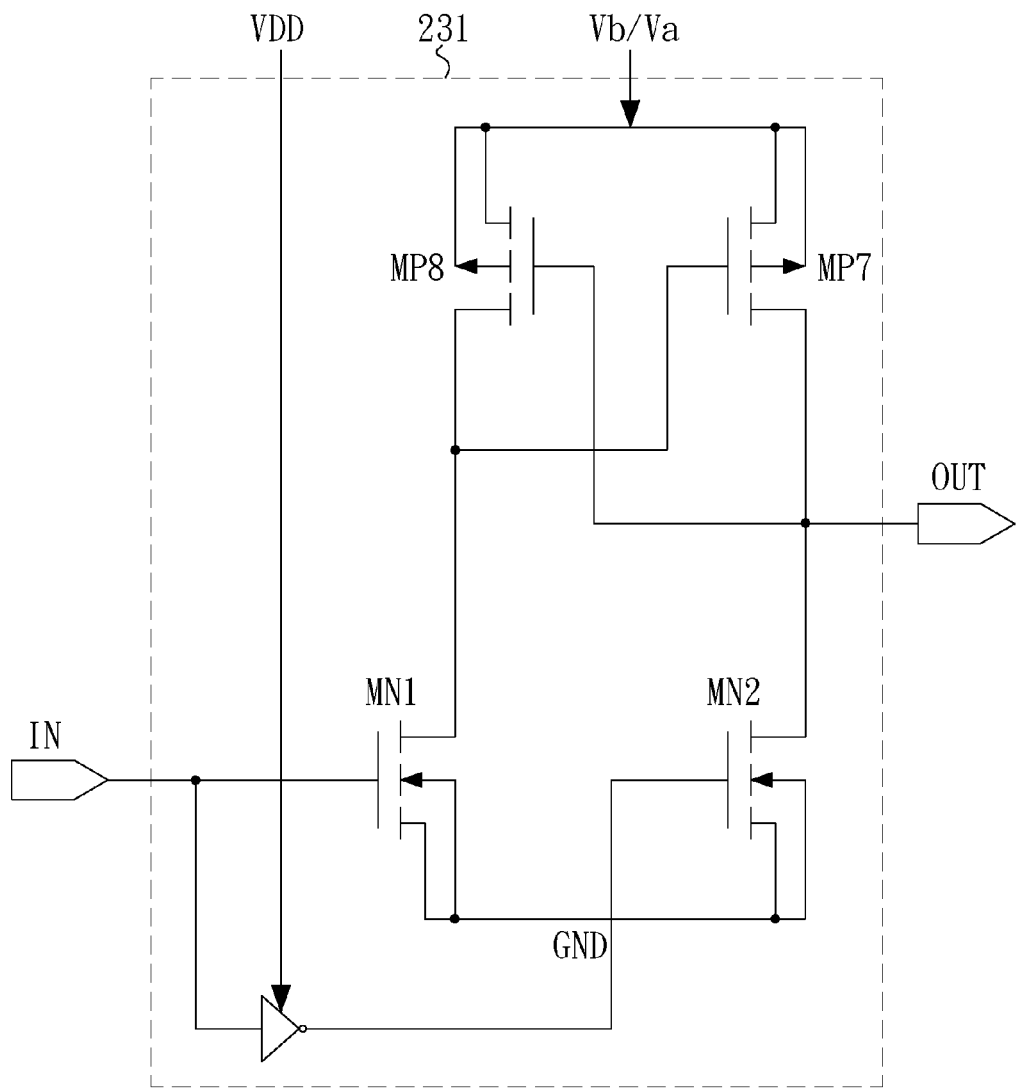
FIG. 7 shows a detailed circuit diagram of the level-shift circuit of FIG. 5 or FIG. 6.

The level-shift circuit 231 as shown in the driving signal generating system 200/201 of FIG. 5/6 may be implemented by a conventional design method for a level-shift circuit. FIG. 7 shows a detailed circuit diagram of the level-shift circuit 231 of FIG. 5 or FIG. 6.

Although specific embodiments have been illustrated and described, it will be appreciated by those skilled in the art that various modifications may be made without departing from the scope of the present invention, which is intended to be limited solely by the appended claims.

What is claimed is:

1. A driving signal generating system, comprising:
a boost circuit providing a power voltage;
an amplifier providing an analog waveform driving signal;
a level shifter providing a digital waveform driving signal; and
a select device selecting the analog waveform driving signal as a driving signal for a touch panel in an analog waveform mode, and selecting the digital waveform driving signal as the driving signal for the touch panel in a digital waveform mode;
wherein the boost circuit provides the power voltage to the amplifier, and the amplifier generates an output voltage as a power in the digital waveform mode for at least one last stage of the level shifter;
wherein the power voltage is greater than a swing of the analog waveform driving signal.

2. The system of claim 1, wherein the boost circuit comprises a charge pump.

3. The system of claim 2, wherein the charge pump comprises a Dickson charge pump.

4. The system of claim 1, wherein the boost circuit comprises a voltage regulator.

5. The system of claim 1, wherein the select device comprises:
an analog waveform switch; and
a digital waveform switch;
wherein the analog waveform switch is closed and the digital waveform switch is open in the analog waveform mode, thereby providing the analog waveform driving signal to the touch panel; the analog waveform switch is open and the digital waveform switch is closed in the digital waveform mode, thereby providing the digital waveform driving signal to the touch panel.

6. The system of claim 1, wherein the amplifier in the analog waveform mode receives an analog input signal that is then amplified to generate the analog waveform driving signal.

7. The system of claim 1, wherein the amplifier in the digital waveform mode receives an input voltage that is then amplified to result in the output voltage.

8. The system of claim 7, further comprising a power switch that is closed in the digital waveform mode such that the output voltage is provided as the power to the at least one last stage of the level shifter.

9. The system of claim 1, wherein the level shifter in the digital waveform mode receives a digital input signal and pulls up a level of the digital input signal, thereby resulting in the digital waveform driving signal.

10. The system of claim 9, wherein the level shifter comprises:
a level-shift circuit coupled to receive the digital input signal;
a first inverting buffer coupled to an output node of the level-shift circuit; and
a second inverting buffer coupled to an output node of the first inverting buffer;
wherein the second inverting buffer uses the output voltage as a power, and at least one last stage of the level-shift circuit and the first inverting buffer use the power voltage of the boost circuit as a power in the digital waveform mode.

11. The system of claim 10, further comprising a logic circuit that controllably passes the digital input signal and feeds the input signal to the level-shift circuit under control of an enable signal.

12. The system of claim 9, wherein the level shifter comprises:
a level-shift circuit coupled to receive the digital input signal;
wherein at least one stage of the level shifter uses the power voltage of the boost circuit as a power in the digital waveform mode.

13. The system of claim 12, further comprising a logic circuit that controllably passes the digital input signal and feeds the input signal to the level-shift circuit under control of an enable signal.

14. The system of claim 1, wherein the amplifier comprises:
an operational amplifier;
a feedback resistor coupled to be connected between an output node and an input node of the operational amplifier; and
an input resistor coupled to be connected to the input node of the operational amplifier.

* * * * *